(12) United States Patent
Lojek

(10) Patent No.: US 6,831,325 B2
(45) Date of Patent: Dec. 14, 2004

(54) MULTI-LEVEL MEMORY CELL WITH LATERAL FLOATING SPACERS

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/327,336

(22) Filed: Dec. 20, 2002

(65) Prior Publication Data

US 2004/0119112 A1 Jun. 24, 2004

(51) Int. Cl.$^7$ .................. H01L 29/788; H01L 29/792
(52) U.S. Cl. .................. 257/315; 257/320; 257/296; 257/314; 257/316
(58) Field of Search ................ 257/315, 320, 257/296, 314, 316

(56) References Cited

U.S. PATENT DOCUMENTS

| | | | |
|---|---|---|---|
| 4,833,096 A | 5/1989 | Huang et al. | 437/29 |
| 5,021,848 A | 6/1991 | Chiu | 357/23.5 |
| 5,477,068 A | 12/1995 | Ozawa | 257/214 |
| 5,479,368 A | 12/1995 | Keshtbod | 365/185.01 |
| 5,618,742 A | 4/1997 | Shone et al. | 438/263 |
| 5,776,787 A | 7/1998 | Keshtbod | 437/43 |
| 5,786,612 A | 7/1998 | Otani et al. | 257/316 |
| 5,789,297 A | 8/1998 | Wang et al. | 438/267 |
| 5,963,806 A | 10/1999 | Sung et al. | 438/266 |
| 5,972,752 A | 10/1999 | Hong | 438/264 |
| 6,043,530 A | 3/2000 | Chang | 257/320 |
| 6,074,914 A | 6/2000 | Ogura | 438/257 |
| 6,091,101 A | 7/2000 | Wang | 257/315 |
| 6,178,113 B1 | 1/2001 | Gonzalez et al. | 365/185.03 |
| 6,255,689 B1 * | 7/2001 | Lee | 257/314 |
| 6,255,691 B1 | 7/2001 | Hashimoto | 257/321 |
| 6,323,088 B1 | 11/2001 | Gonzalez et al. | 438/257 |
| 6,479,351 B1 | 11/2002 | Lojek et al. | 438/266 |
| 6,531,735 B1 * | 3/2003 | Kamigaki et al. | 257/324 |
| 2003/0013255 A1 | 1/2003 | Lojek et al. | 438/266 |

FOREIGN PATENT DOCUMENTS

| | | |
|---|---|---|
| JP | 11-154712 | 6/1999 |
| JP | 11-186416 | 7/1999 |
| WO | WO02/45176 | 6/2002 |

* cited by examiner

Primary Examiner—Jerome Jackson
Assistant Examiner—Joseph Nguyen
(74) Attorney, Agent, or Firm—Schneck & Schneck; Thomas Schneck

(57) ABSTRACT

A multi-level non-volatile memory transistor is formed in a semiconductor substrate. A conductive polysilicon control gate having opposed sidewalls is insulatively spaced just above the substrate. Conductive polysilicon spacers are separated from the opposed sidewalls by thin tunnel oxide. Source and drain implants are beneath or slightly outboard of the spacers. Insulative material is placed over the structure with a hole cut above the control gate for contact by a gate electrode connected to, or part of, a conductive word line. Auxillary low voltage transistors which may be made at the same time as the formation of the memory transistor apply opposite phase clock pulses to source and drain electrodes so that first one side of the memory transistor may be written to, or read, then the other side.

4 Claims, 7 Drawing Sheets

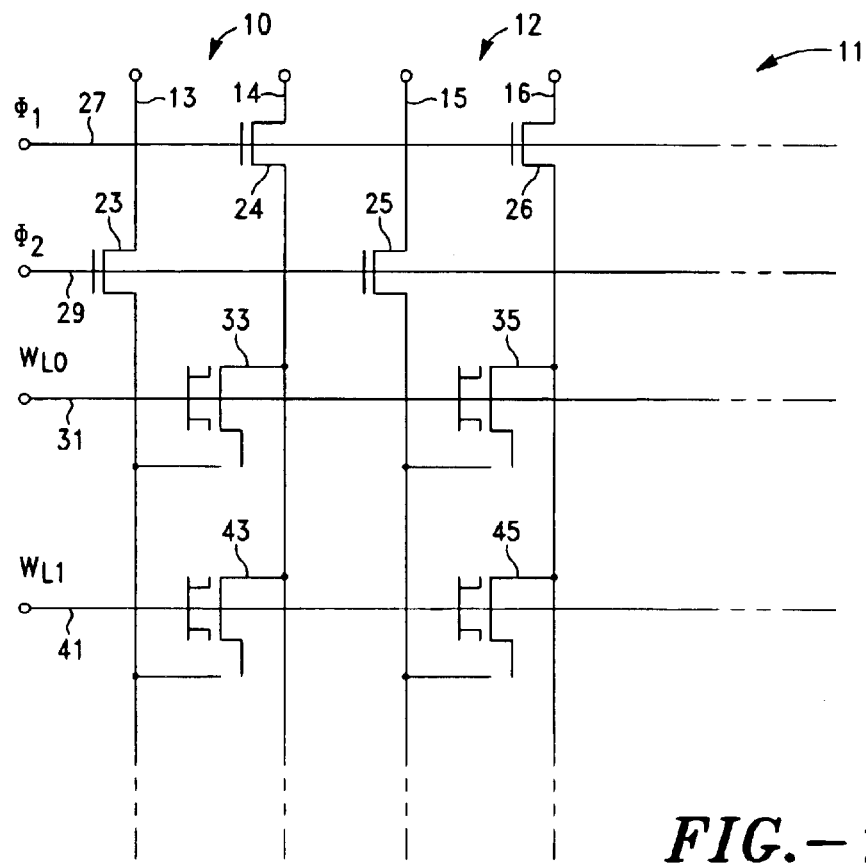
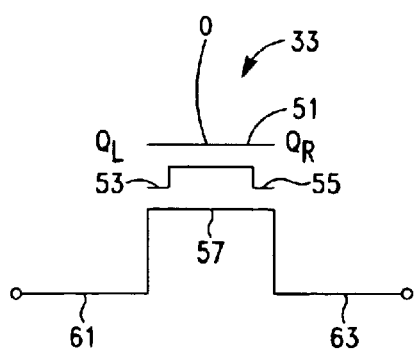
FIG.-2
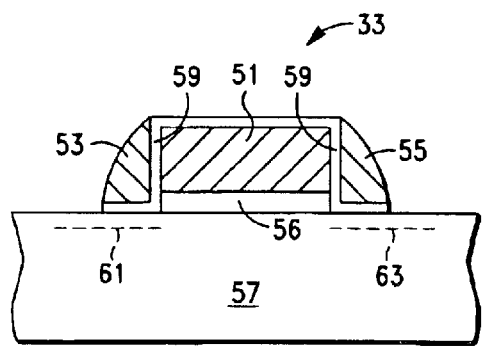
FIG.-3

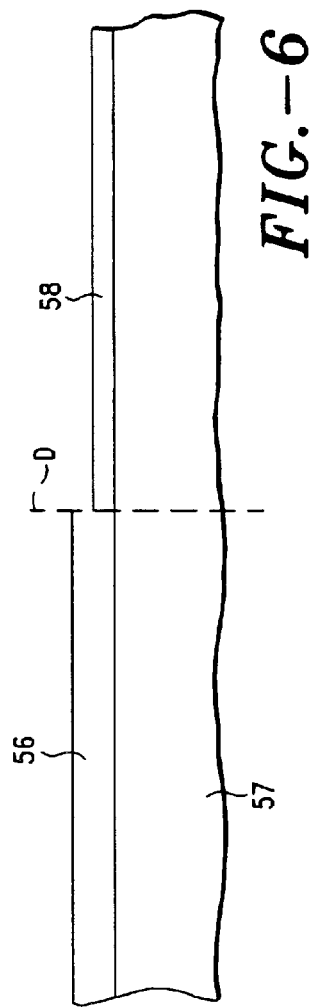
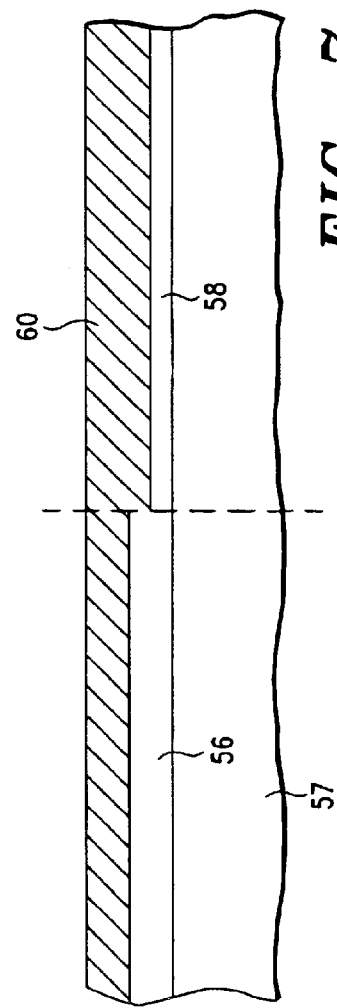
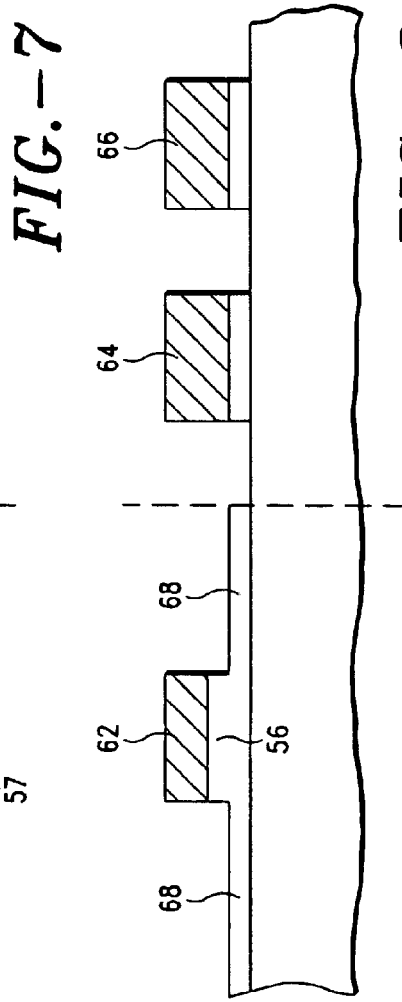

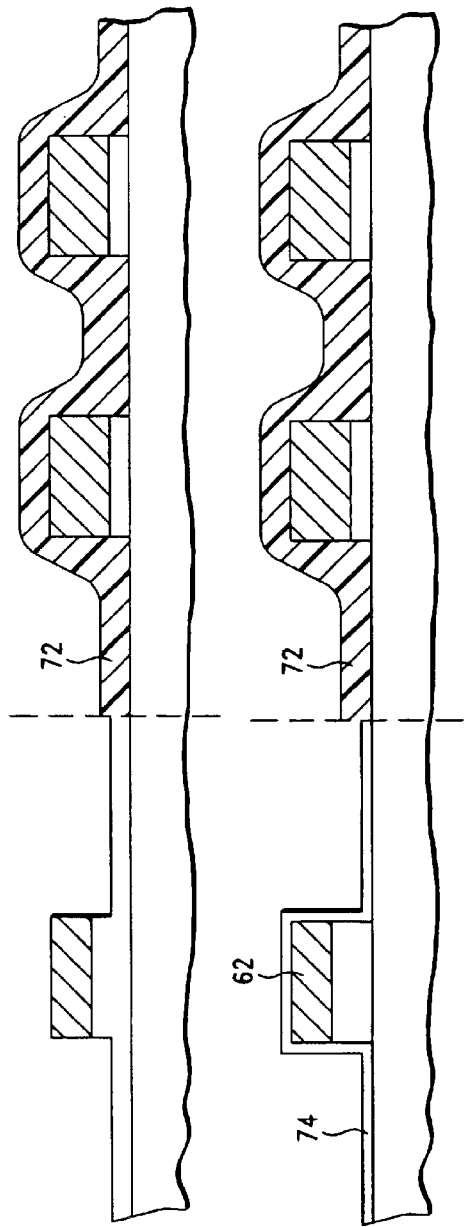
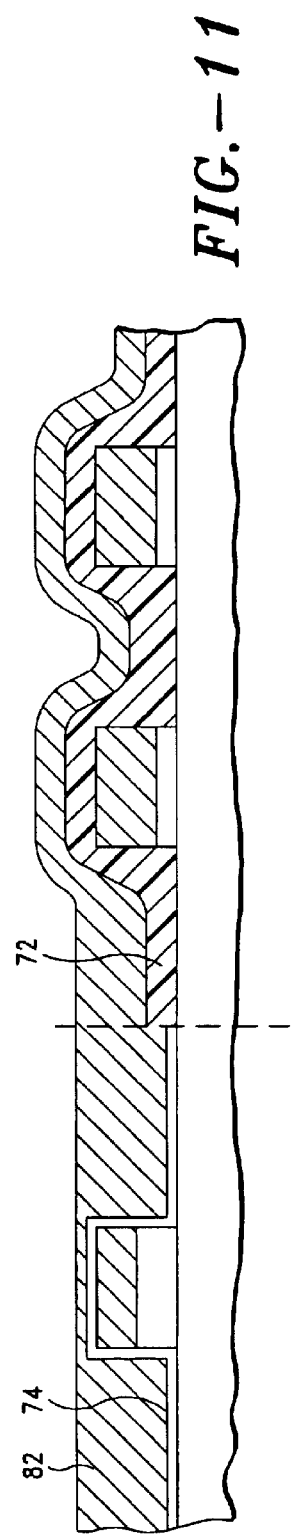
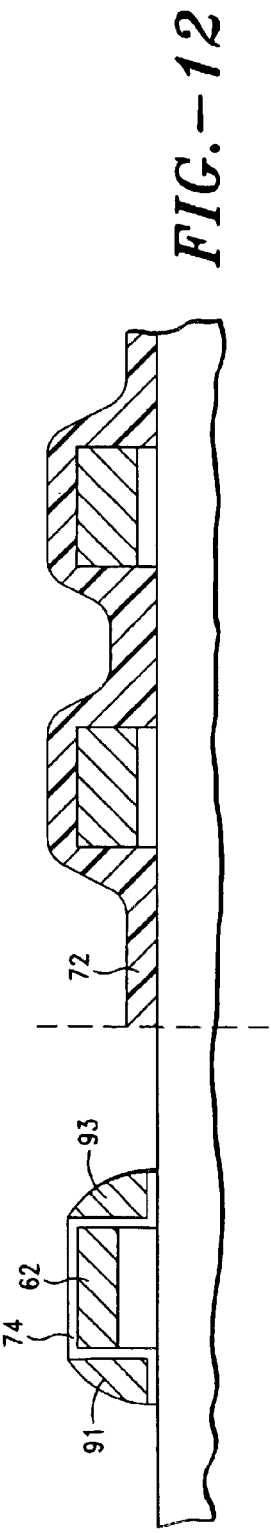
FIG.-9
FIG.-10
FIG.-11
FIG.-12

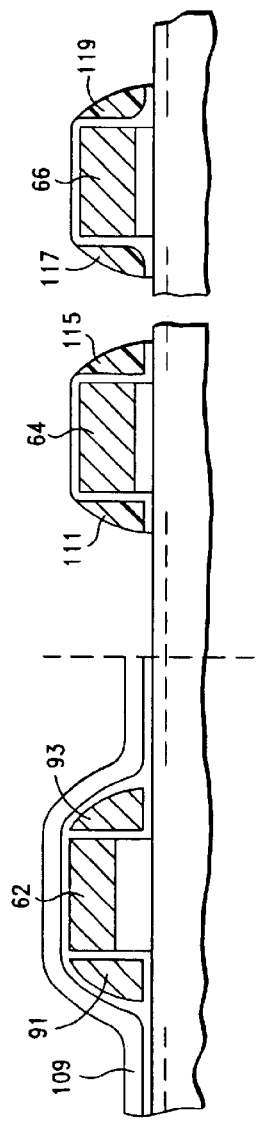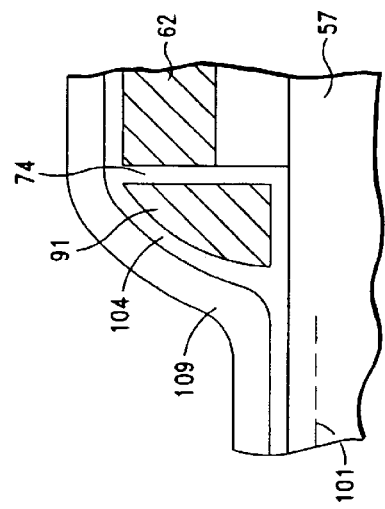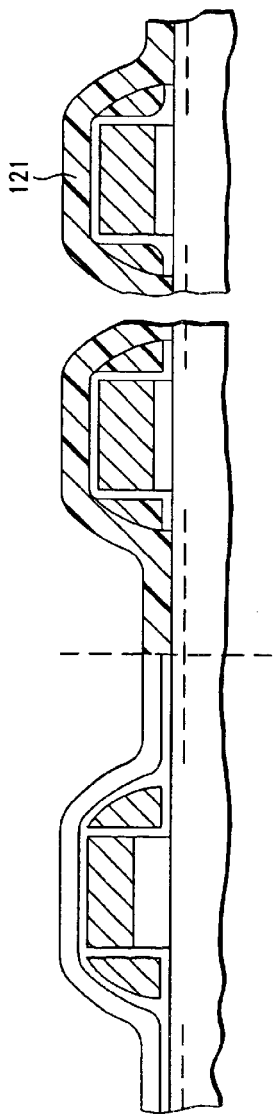

MULTI-LEVEL MEMORY CELL WITH LATERAL FLOATING SPACERS

TECHNICAL FIELD

The invention relates to semiconductor integrated memory cells and, in particular, to multibit charge storage transistors.

BACKGROUND ART

In the past, nonvolatile memory transistors stored only one binary bit. In EEPROM (electrically eraseable programmable read only memory) transistors such charge storage occurs on a floating gate and so, such transistors are referred to as floating gate memory cell transistors. In order to store two binary bits in an EEPROM transistor, some modification of the transistor design is needed. Multibit charge storage transistors are known, including nonvolatile multibit transistors.

In U.S. Pat. No. 6,323,088, Gonzalez et al. teach the use of two floating gates, placed side-by-side, beneath a control gate to form a multi-level memory cell. The control gate is connected to a word line over both of the floating gates while the active subsurface source and drain regions are connected to respective digit lines. By appropriately controlling the voltage and timing applied to the word line and the digit lines, separate charges can be stored and read from each of the two floating gates of the single transistor. Use of the two floating gates allows storage of two independent bits of information by separately controlling charge stored in each of the two floating gates.

In U.S. Pat. No. 6,178,113, Gonzalez et al. teach another type of multi-level memory cell. Once again a pair of floating gates are provided beneath a control gate, with electrode connections as in the previously mentioned patent. However, here one or each of the floating gates is associated with a side insulator and an associated doped region next to the insulator, forming a capacitor across the side insulator with a floating gate. So now the structure has the properties of side-by-side capacitive structures fabricated as a single EEPROM transistor but with multi-level storage.

While the above structures are significant contributions to the state of the art, even more compact structures are needed for embedded memory applications. In embedded memory, a circuit board might have a principal function, such as a processor function or a communications function. Frequently such boards contain microprograms to control operation or to store data. It is desirable to provide a single chip with high-density memory, rather than to rely on a plurality of separate memory chips. While use of multi-level memory chips would provide a solution, such chips are often larger than conventional transistors and so part of the advantage of such a solution is lost. An object of the invention was to devise a nonvolatile multi-level memory transistor, particularly an EEPROM, that is comparable in size to single bit nonvolatile memory chips.

SUMMARY OF THE INVENTION

The above object has been met with a nonvolatile memory transistor that uses a pair of polysilicon floating spacer structures for storage of two data bits. The two spacers are on opposite sides of a single central conductive gate, but separated from the conductive gate by tunnel oxide having a thickness in the range of 10–50 angstroms. Tunnel oxide also separates the floating spacer structures from subsurface source and drain electrode regions. In this arrangement, the spacers themselves behave as principal conductive charge storage floating members on either side of the single central gate that is wired to be the control gate. In this manner the two binary bit lateral charge storage members of the present invention use approximately the same space as a conventional EEPROM cell using nitride or oxide spacers, while not increasing vertical dimensions. Charge is stored and isolated within the floating spacers by tunneling action with respect to both the substrate and the central gate. The control gate is wired as a word line, while the subsurface source and drain regions are the digit lines which are each connected to auxiliary transistors controlling phases for addressing each side of the memory cell independently.

BRIEF DESCRIPTION OF THE DRAWINGS

FIG. 1 is a schematic drawing of a portion of a memory array on an integrated circuit chip employing multi-level non-volatile memory cells of the present invention.

FIG. 2 is an electrical schematic drawing of a multi-level non-volatile memory cell shown in FIG. 1.

FIG. 3 is a side sectional view of a multi-level non-volatile memory cell shown in FIG. 2, as constructed in a silicon process fabrication of the cell, as taken along lines 3—3 of FIG. 5.

FIGS. 6–22 are side sectional views of steps in a silicon process fabrication of a memory cell and two ancillary transistors, shown in FIG. 1 and manufactured at the same time.

DESCRIPTION OF THE INVENTION

Figure 5:
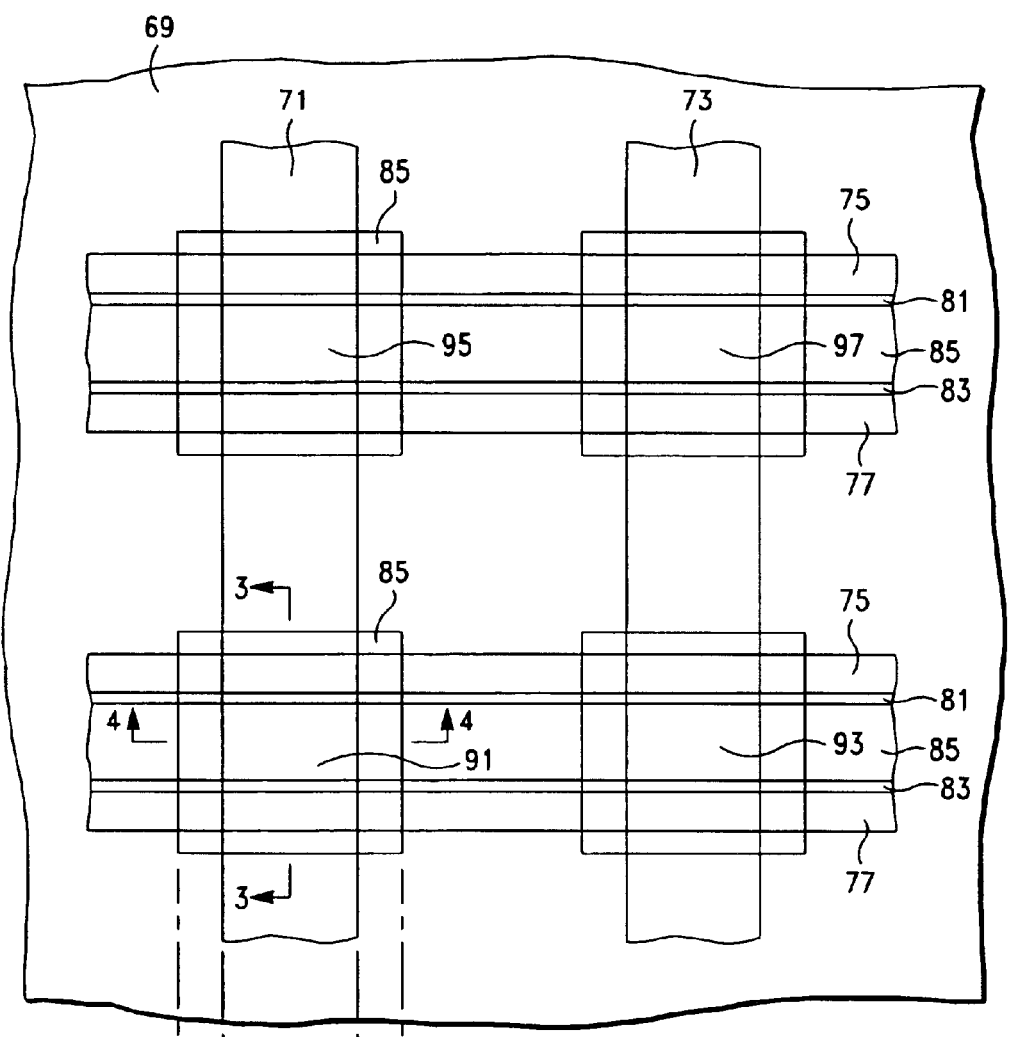
FIG. 5 is a top view of a multi-level non-volatile memory cell shown in FIG. 2, as constructed in a silicon process fabrication of the memory cell.

With reference to FIG. 1, a non-volatile memory array 11 is shown having memory array columns 10 and 12 with respective columnar lines 13 and 14 for array column 10 which, together, form a single bitline. Similarly, columnar lines 15 and 16 define a second bitline for array column 12. Between columnar lines 13 and 14 a first non-volatile memory transistor 33 and a second non-volatile memory transistor 43 are situated. In the second bitline, between columnar lines 15 and 16, third and fourth non-volatile memory transistors 35 and 45 are situated. Also associated with the first bitline are ancillary low voltage transistors 23 on timing line 29 and ancillary transistor 24 on timing line 27. Similarly, associated with the second bitline, ancillary low voltage transistor 25 is associated with timing line 29 and ancillary low voltage transistor 26 is associated with timing line 27. The function of the ancillary transistors will be explained below.

With reference to FIG. 2, the non-volatile memory transistor device 33 may be seen to have a control gate 51, a substrate 57 and left and right storage sites 53 and 55. The transistor device also has a source electrode 61 and a drain electrode 63.

In FIG. 3, the device 33 is seen to be constructed on a silicon substrate 57 having a subsurface active region with source and drain implants 61 and 63 respectively. Control gate 51 is separated from the substrate by an oxide layer 56. Near opposite lateral edges of the control gate 51, conductive polysilicon spacers 53 and 55 are constructed in a manner so that they are separated from the control gate 51 and from the substrate by a very thin layer of tunnel oxide, approximately 25 to 70 angstroms thick. The spacers are upright structures, thinner at their top and wider at their base, having the cross-sectional appearance of a right triangle, with the top of each spacer at a level near the top of the control gate. The thickness of the tunnel oxide is selected to allow electron tunneling from the subsurface electrodes 61 and 63 into the floating polysilicon spacers 53 and 55 by means of an appropriate potential on the control gate 51.

Unlike floating gate transistors of the prior art, where the control gate is atop the floating gate in vertical arrangement with respective substrate, the present invention features a lateral construction where the floating regions are to the side of the control gate and above active regions of the substrate. This lateral construction allows memory devices of the present invention to be approximately the same height as ancillary transistors employing nitride spacers. This has advantages in fabrication and reliability of finished devices.

Each of the spacers can store charge independently of the other spacer. This allows two binary bits to be stored independently, giving rise to four states. If the spacers are designated $Q_L$ and $Q_R$, then four data states are feasible, as shown in the table below.

| Data | $Q_L$ | $Q_R$ |
|------|-------|-------|
| 0 0  |       |       |
| 1 0  | −Q    |       |
| 0 1  |       | −Q    |
| 1 1  | −Q    | −Q    |

To designate data state 0,0 both spacers have no charge. To designate the state 1,0 the left spacer has an amount of charge designated "−Q" and the right spacer has no charge. To designate the state 0,1 the left spacer, $Q_L$, has no charge and the right spacer, $Q_R$, has an amount of charge designated "−Q". In order to designate the data state 1,1 both right and left spacers have an amount of data charge "−Q".

Figure 4:
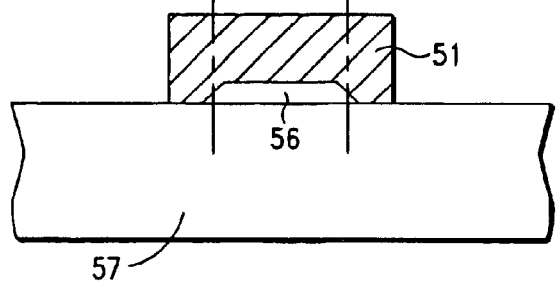
FIG. 4 is another a side sectional view of a multi-level non-volatile memory cell shown in FIG. 2, as constructed in a silicon process fabrication of the cell, as taken along lines 4—4 of FIG. 5.

The sectional view of FIG. 4 shows the transistor of FIG. 3 with gate 51 spaced above substrate 57 by oxide 56. With reference to FIG. 5, active regions and substrate 69 are defined with subsurface doping indicated by stripes 71 and 73. In subsequent processing steps, further doping will define source and drain regions within the active region stripes 71 and 73. Edges of tunnel oxide stripes 81 and 83 may be seen, over which the polysilicon spacer stripes 75 and 77 are deposited. One of the final steps in processing is the deposition of a polysilicon cap 85 over each of the cells 91, 93, 95 and 97. From FIG. 5, it is seen that construction of cells in the present invention may be achieved with a stripe linear geometry. The stripes 71 and 73 defining active the active regions are perpendicular to all other stripes. Polysilicon spacer stripe portions between cells are removed in finishing individual devices, but such removal is not shown in FIG. 5, but is described in below. The following figures describe the step-by-step self-formation process with illustration of significant steps. Intermediate masking steps are not shown but may be deduced from what is shown. Also, the drawings illustrate memory cell formation on the left side of each drawing and simultaneous ancillary low voltage gate formation on the right hand side of each drawing.

With reference to FIG. 6, the divider line, D, separates memory cell formation on the left and ancillary low voltage transistor formation on the right. FIG. 6 shows substrate 57 having a layer of gate oxide 56 on the left side. To the right of line, D, a transistor with a different oxide 58 thickness is placed over common substrate 57. The oxide could be thinner or thicker depending on the type of device.

In FIG. 7, a layer of polysilicon 60 is deposited over the oxide regions 56 and 58. The polysilicon layer 60 will form poly gates for the diverse transistors.

In FIG. 8, the polysilicon layer of FIG. 7 has been etched to form mesas. The mesa in the memory cell area becomes a polysilicon control gate 62 above the full height of a portion of an oxide layer 56 previously described. At the same time, gates 64 and 66 are defined for low voltage transistors. The polysilicon shown in FIG. 7 has been etched away to form the mesas. Oxide adjacent to the mesas has been removed by etching. Adjacent to polysilicon gate 62 some residual oxide remains in regions 68.

In FIG. 9, the low voltage transistors are protected by an insulative layer 72. The protective layer may be TEOS mask formed by the decomposition of tetraethyl orthosilicate.

In FIG. 10, the residual oxide has been removed and a new thin layer of tunnel oxide 74 is deposited over polysilicon gate 62. The tunnel oxide layer has a thickness typically ranging between 25–70 angstroms. Thin oxide may be deposited over the TEOS mask 72, but is inconsequential in the low voltage region.

In FIG. 11, a polysilicon layer 82 is deposited over the tunnel oxide layer 74, as well as over the TEOS layer 72. Arsenic is implanted into the polysilicon layer 82 to adjust conductivity for the spacers formed in FIG. 12 by etching away polysilicon.

In FIG. 12, the polysilicon layer of FIG. 11 has been etched defining spacers 91 and 93 on both sides of the polysilicon gate 62 but spaced from the gate by tunnel oxide layer 74. The polysilicon spacers 91 and 93 have the shape and size of conventional insulative spacers. However, polysilicon spacers 91 and 93 are conductive, intended to store charge with tunneling into the spacers from the substrate through the thin oxide. The upwardly extending thin oxide allows control gate 62 to communicate control signals individually to the polysilicon spacers 91 and 93 in a manner described below based upon timing signals applied to substrate electrodes.

By removing most of the polysilicon from the wafer, the insulative TEOS layer 72 is exposed over the transistors with different oxide thicknesses. This TEOS layer is etched away, as seen in FIG. 13, while at the same time the memory cell is protected by a nitride layer 95 extending over the memory cell, including the poly spacers 91 and 93, as well as the control gate 62.

Figures 13, 14, 15, 16:
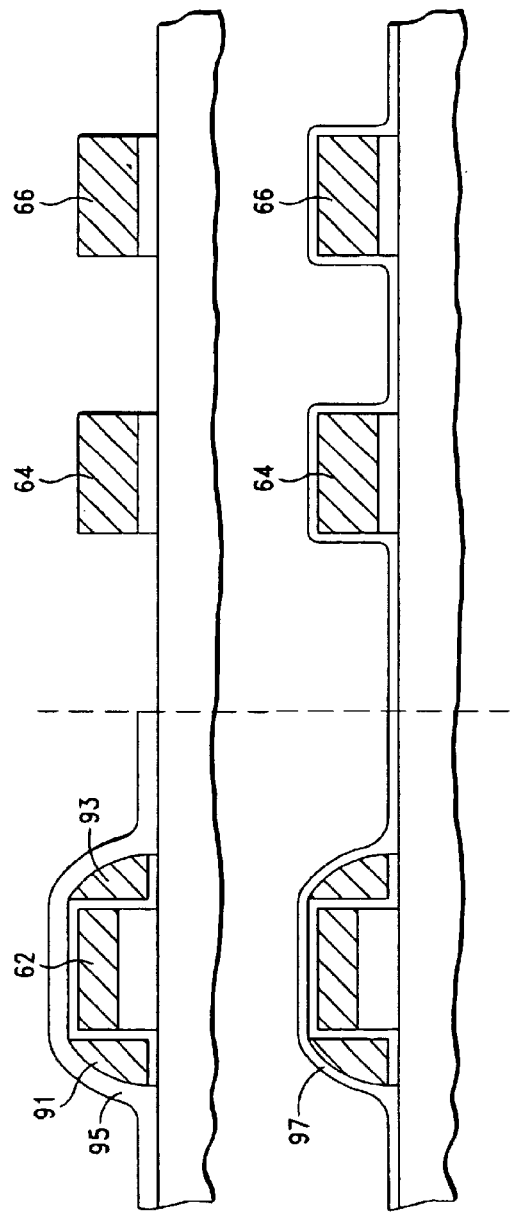

In FIG. 14, the insulative nitride layer 95 is removed and a thick oxide layer 97 is substituted. Oxide layer has a thickness of approximately 1,500 angstroms and extends over the poly gates of the low voltage transistors.

In FIG. 15, the oxide is removed except over the mesa regions including the poly spacers 91 and 93. On each side of the spacers an ion implantation is made, forming subsurface source and drain regions 101 and 103 of lightly doped N-type material slightly outboard of the respective poly spacers 91 and 93, or slightly beneath the spacers. Similar regions are formed slightly outboard of both sides of mesa 64. P-type ions are injected on either side of mesa 66, opposite the conductivity type of subsurface regions on either side of mesa 64. This will allow formation of low voltage P- and N-type transistors. In FIG. 16, a new nitride layer 109 is deposited over all transistors.

In FIG. 17, it can be seen that the nitride is etched in the low voltage transistor region, leaving nitride spacers 111 and 115 on opposite sides of mesa 64, a poly gate. Similarly, nitride spacers 117 and 119 are on either side of mesa 66, another poly gate. The low voltage transistors are now fully formed with source and drain electrodes. Sources and drains are the implant regions in the substrate, while the gate for each transistor is the polysilicon mesa structure above the substrate. Nitride 109 remains above the poly gate 62 and the poly spacers 91 and 93.

In FIG. 18, the polysilicon spacer 91 is seen to be a floating spacer insulated from the poly gate 62 by vertically extending tunnel oxide and insulated from substrate 57 by horizontally extending tunnel oxide. Separate oxide layer 104 separates poly spacer 91 from nitride layer 109. The doped subsurface region 101, a source region, can communicate electrons through the tunnel oxide to the floating spacer 91 where charge is preserved, with an appropriate voltage potential placed on the gate 62 to manipulate charge onto the floating spacer. To discharge the floating spacer, the poly gate 62 assumes an opposite voltage, which causes tunneling of electrons back toward source 101. Timing signals applied to source and drain regions 101 and 103 determine which of the spacers 91 and 93 is to be read or written to.

In FIG. 19, an insulative TEOS layer 121 is deposited over the wafer but is etched from the memory area, leaving the TEOS layer on the low voltage transistors.

Figure 20:
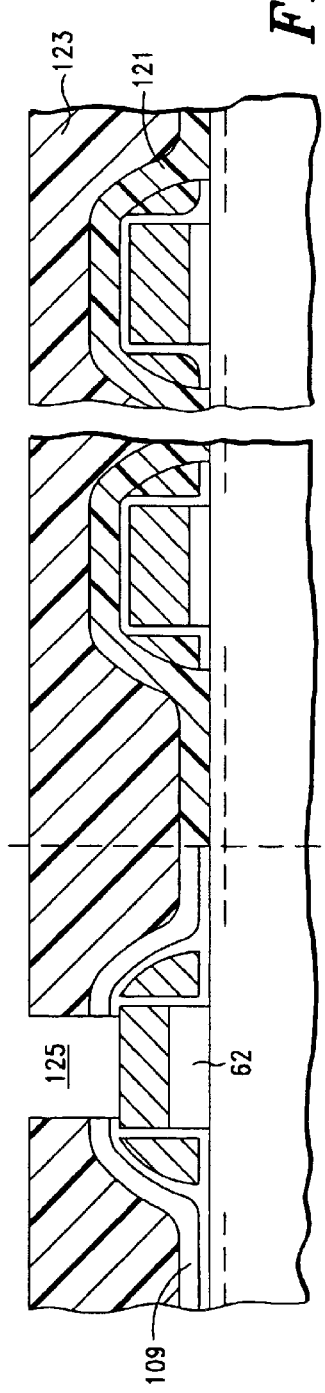

In FIG. 20, a thick nitride layer 123 is deposited over the entire wafer including the TEOS layer 121 and the nitride layer 109 in the memory cell area. An opening 125 is cut into the nitride layer centered on the gate 62.

Figure 21:
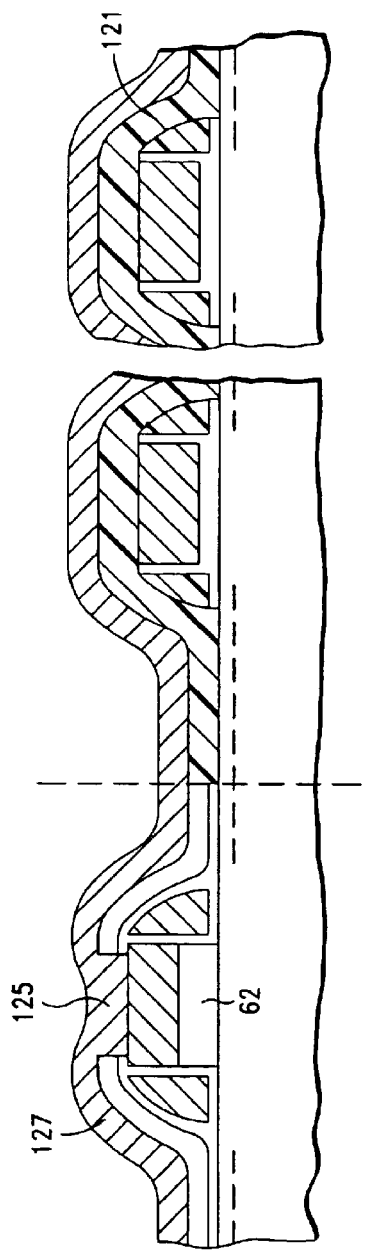
Figure 22:
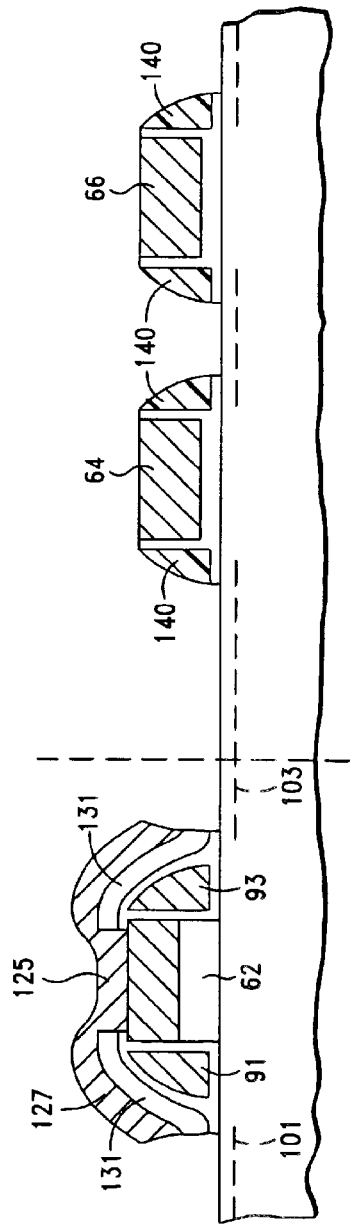

In FIG. 21, the nitride layer 123 is seen to be removed and replaced by a polysilicon layer 127 which fills the opening 125 thereby forming a gate electrode making contact with polysilicon gate 62. A supply voltage communicated to layer 127 and into opening 125 is transferred to gate 62 for reaching or writing charge on poly spacers 91 and 93 depending on voltages applied to source 101 or drain 103. The polysilicon layer also extends over the TEOS layer 121 in the low voltage area. Next, the polysilicon is trimmed in a memory cell area so that it resides only over the memory cell. The polysilicon and TEOS is completely removed from the low voltage area, thereby leaving the gates 64 and 66, each with nitride spacers 140 above the substrate. The low voltage transistors are fully formed. Similarly, the memory cell transistor is fully formed with polysilicon gate 62 separated from poly spacers 91 and 93 by tunnel oxide. A layer of oxide extends above the poly spacers 91 and 93 and a partial layer of nitride 131 and 133 extends over the poly spacers 91 and 93 respectively. A partial poly layer 127 makes contact with the control gate at region 125 so that word line voltages can be applied to the control gate. Digit line signals are applied to the polysilicon spacers 91 and 93 as previously described.

In operation, referring to FIG. 1, the low voltage transistors 23 and 24 are activated by opposite phase clock pulses on lines 27 and 27, allowing bias voltage, $V_{SS}$ and $V_{SS}$ to be applied alternately to source and drain electrodes of memory cells along lines 13 and 14. At the same time, a word line 31 applies a programming or read voltage, $V_{PP}$, to selected transistor 33 along line 31. The entire array 11 operates similarly so that two bits can be stored on each of the array transistors 33, 35, 43 and 45.

What is claimed is:

1. A non-volatile memory transistor capable of storing two binary bits comprising:
    a semiconductor substrate having an active region with spaced apart source and drain regions in the active region;
    a first insulative layer disposed over the substrate;
    a polysilicon gate disposed over the insulative layer, the polysilicon gate having sidewalls;
    a pair of polysilicon upright spacers acting as charge storage regions spaced apart on opposite sides of the polysilicon gate adjacent to the sidewalls but separated therefrom and from the substrate by tunnel oxide;
    a second insulative layer covering the upright spacers and the polysilicon gate, thereby allowing the spacers to be electrically floating structures;
    a conductive layer over the second insulative layer and contacting the polysilicon gate through an opening in the second insulative layer, the conductive layer having a voltage supply associated therewith, thereby allowing the polysilicon gate to serve as a control gate; and
    timing means for applying voltage alternately to one of the source and drain regions and then the other whereby each of the upright spacers may be independently read or written in cooperation with the voltage applied to the conductive layer.

2. The memory transistor of claim 1 wherein said timing means comprises a pair of opposite phase transistors connected to power supplies for first raising the level of one of the source and drain regions and then the other.

3. A non-volatile memory transistor capable of storing two binary bits comprising:
    a semiconductor substrate having an active region with spaced apart source and drain regions in the active region;
    a first insulative layer disposed over the substrate;
    a conductive polysilicon gate disposed over the insulative layer, at least part of the polysilicon gate between the source and drain the polysilicon gate having sidewalls;
    a pair of conductive polysilicon upright spacers acting as charge storage regions spaced apart on opposite sides of the polysilicon gate adjacent to the sidewalls but separated therefrom and from the substrate by tunnel oxide; and
    timing means for applying voltage alternately to one of the source and drain regions and then the other whereby each of the upright spacers may be independently read or written by charge transfer to and from the polysilicon gate through the tunnel oxide.

4. In a memory array having rows and columns of memory cells, each memory cell having a non-volatile memory transistor capable of storing one of four memory states comprising:
    a semiconductor substrate having an active region with spaced apart source and drain regions in the active region;
    a first insulative layer disposed over the substrate;
    a conductive polysilicon gate disposed over the insulative layer, at least part of the polysilicon gate between the source and drain, the polysilicon gate having sidewalls;
    a pair of conductive polysilicon upright spacers acting as charge storage regions spaced apart on opposite sides of the polysilicon gate adjacent to the sidewalls but separated therefrom and from the substrate by tunnel oxide; and
    means for applying voltage to each of the source and drain regions independently at different times whereby each of the upright spacers may be independently read or written alternately at different times whereby both spacers may be charged, or neither spacer charged, or either spacer charged giving rise to four memory states for each memory cell.

* * * * *